United States Patent
Kim et al.

(10) Patent No.: US 8,026,140 B2
(45) Date of Patent: Sep. 27, 2011

(54) METHOD OF FORMING FLASH MEMORY DEVICE

(75) Inventors: Hee Soo Kim, Yongin-si (KR); Jae Mun Kim, Seoul (KR)

(73) Assignee: Hynix Semiconductor Inc., Icheon-si, Gyeonggi-do (KR)

(*) Notice: Subject to any disclaimer, the term of this patent is extended or adjusted under 35 U.S.C. 154(b) by 116 days.

(21) Appl. No.: 12/344,447

(22) Filed: Dec. 26, 2008

(65) Prior Publication Data

US 2009/0181517 A1 Jul. 16, 2009

(30) Foreign Application Priority Data

Jan. 14, 2008 (KR) .................. 10-2008-0003975

(51) Int. Cl.
*H01L 21/336* (2006.01)

(52) U.S. Cl. ........ 438/257; 438/264; 438/593; 438/594; 257/E21.546

(58) Field of Classification Search .......... 438/257–265, 438/593–594
See application file for complete search history.

(56) References Cited

U.S. PATENT DOCUMENTS

| | | | |
|---|---|---|---|
| 2006/0205150 A1* | 9/2006 | Dong | 438/257 |
| 2006/0292794 A1* | 12/2006 | Joo | 438/257 |
| 2007/0190727 A1* | 8/2007 | Hazama et al. | 438/264 |
| 2008/0090352 A1* | 4/2008 | Lee et al. | 438/257 |
| 2008/0246101 A1* | 10/2008 | Li et al. | 257/412 |

FOREIGN PATENT DOCUMENTS

| | | |
|---|---|---|
| KR | 1020070039645 | 4/2007 |
| KR | 1020070075092 | 7/2007 |

OTHER PUBLICATIONS

Korean office action dated Apr. 20, 2011 for 10-2008-0003975, citing the above reference(s).

* cited by examiner

*Primary Examiner* — Thanh Nguyen
(74) *Attorney, Agent, or Firm* — Lowe Hauptman Ham & Berner LLP

(57) ABSTRACT

The present invention relates to a method of forming a flash memory device, which is capable of forming floating gates. According to a method of forming a flash memory device in accordance with the present invention, isolation mask patterns are first formed over a semiconductor substrate. Trenches are formed by performing an etching process using the isolation mask patterns. Isolation layers are formed between the isolation mask patterns, including the insides of the respective trenches. The isolation mask patterns are removed. Tunnel dielectric layers and crystallized first conductive layers are sequentially formed over the exposed semiconductor substrate. A dielectric layer and a second conductive layer are formed over the isolation layers and the first conductive layers.

9 Claims, 3 Drawing Sheets

METHOD OF FORMING FLASH MEMORY DEVICE

CROSS-REFERENCES TO RELATED APPLICATION

The present application claims priority to Korean patent application number 10-2008-003975, filed on Jan. 14, 2008, which is incorporated by reference in its entirety.

BACKGROUND OF THE INVENTION

The present invention relates to a method of forming a flash memory device and, more particularly, to a method of forming a flash memory device, which is capable of forming floating gates.

A flash memory device includes a floating gate for storing data and a control gate for transferring voltages.

More specifically, a flash memory device is formed by stacking a tunnel dielectric layer, a floating gate, a dielectric layer, and a control gate over a semiconductor substrate. When a program voltage is applied to the control gate, the coupling ratio between the floating gate and the control gate increases, and electrons are tunneled from the semiconductor substrate to the inside of the floating gate. Accordingly, the threshold voltage rises, so a program operation is performed.

In particular, electrons stored in the floating gate are concentrated more on a surface than in the inside of the floating gate. It is advantageous to increase the area of the floating gate in order to prohibit a shift in the distribution of threshold voltages.

Meanwhile, as the level of integration increases, it becomes difficult to align floating gates on an active area. Accordingly, after forming a conductive layer for the floating gates is formed over a semiconductor substrate, trenches for isolation may be formed by performing an etching process using an isolation mask pattern so that the floating gates are automatically aligned. This is called as a Self-Aligned Floating Gate (SAFG) method.

Further, even in the SAFG method, in order to increase the volumes of floating gates, after a first conductive layer and an isolation layer are formed, a second conductive layer for the floating gates are further formed over the first conductive layer. More specifically, a tunnel dielectric layer and a first conductive layer for floating gates are formed over a semiconductor substrate. An isolation mask pattern is formed on the first conductive layer. An etching process is performed using the isolation mask pattern, thus forming trenches for isolation. In view of the etching process, a width at the bottom of the isolation mask pattern is narrower than that at the top thereof, thus forming a negative profile. Next, after an isolation layer is formed within the trenches, the isolation mask pattern is removed in order to expose the first conductive layer. Next, a second conductive layer for floating gates is formed over the first conductive layer. Since a width at the top of a region from which the isolation mask pattern has been removed is narrower than that at the bottom thereof, overhang is likely to happen when forming the second conductive layer. Accordingly, void or seam may be generated within the second conductive layer. If void or seam is generated within the floating gates, the electrical characteristics of the flash memory device may be deteriorated, resulting in low reliability.

BRIEF SUMMARY OF THE INVENTION

According to the present invention, after isolation layers protruding upwardly from a semiconductor substrate are formed in a semiconductor substrate in which trenches are formed, the thickness of each of the protruded isolation layers is lowered in order to widen a gap between the protruded isolation layers. Next, a tunnel dielectric layer and a conductive layer for floating gates are formed between the protruded isolation layers, each having a widened gap, so that the occurrence of void or seam can be prevented.

According to a method of forming a flash memory device in accordance with an aspect of the present invention, isolation mask patterns are first formed over a semiconductor substrate. Trenches are formed by performing an etching process using the isolation mask patterns. Isolation layers are formed between the isolation mask patterns, including the insides of the respective trenches. The isolation mask patterns are removed. Tunnel dielectric layers and crystallized first conductive layers are sequentially formed over the exposed semiconductor substrate. A dielectric layer and a second conductive layer are formed over the isolation layers and the first conductive layers.

The crystallized first conductive layers may be formed from a polysilicon layer. The polysilicon layer may be formed using a mixed gas of a $SiH_4$ gas, that is, a silicon source gas, and an $N_2$ gas, that is, a reaction gas. Further, the polysilicon layer may be formed in a temperature range of 650° C. to 750° C. at a pressure of 10 Torr to 300 Torr.

Each of the crystallized first conductive layers may have a grain size of 15 nm to 30 nm. Each of the crystallized first conductive layers may be formed by sequentially stacking an undoped polysilicon layer and a doped polysilicon layer.

The undoped polysilicon layer and the doped polysilicon layer may be formed by supplying a silicon source gas and a reaction gas. The silicon source gas may include a $SiH_4$ gas, and the reaction gas may include an $N_2$ gas.

The undoped polysilicon layer and the doped polysilicon layer may be formed in a temperature range of 650° C. to 750° C. at a pressure of 10 Torr to 300 Torr. The doped polysilicon layer may be formed in-situ or ex-situ after the undoped polysilicon layer is formed. The doped polysilicon layer may be formed by injecting $PH_3$.

The doped polysilicon layer may be formed by injecting Phosphorus (P) at a concentration of $5.0 \times 10^{19}$ atoms/cm$^3$ to $7.0 \times 10^{20}$ atoms/cm$^3$.

Before the isolation mask patterns are formed, a screen insulating layer may be further formed on the semiconductor substrate. The screen insulating layer may be formed to a thickness of 10 Å to 50 Å.

Before the isolation layers are formed, a wall insulating layer may be further formed on the entire surface of the semiconductor substrate exposed through the trenches.

After the isolation mask patterns are removed, a cleaning process of removing impurities on the exposed surface of the semiconductor substrate may be further performed. At this time, a thickness of each of the isolation layers may decrease.

According to a method of forming a flash memory device in accordance with another aspect of the present invention, trenches are first formed in a semiconductor substrate. Isolation layers are formed within the respective trenches, wherein part of each of the isolation layers may protrude upwardly from the semiconductor substrate. A gap between the protruded isolation layers is widened. A first conductive layer is gap-filled between the protruded isolation layers. A dielectric layer and a second conductive layer are sequentially formed over the first conductive layer and the protruded isolation layers.

The formation of the trenches in the semiconductor substrate may include sequentially forming a screen insulating layer and an isolation mask pattern over the semiconductor substrate, and etching the screen insulating layer and the semiconductor substrate using the isolation mask patterns.

After the trenches are formed, an oxidization process may be performed. When the oxidization process is performed, a wall insulating layer may be further formed on the entire surface of the semiconductor substrate, including top corners of the semiconductor substrate exposed through the trenches.

DESCRIPTION OF SPECIFIC EMBODIMENT

Figure 1A:
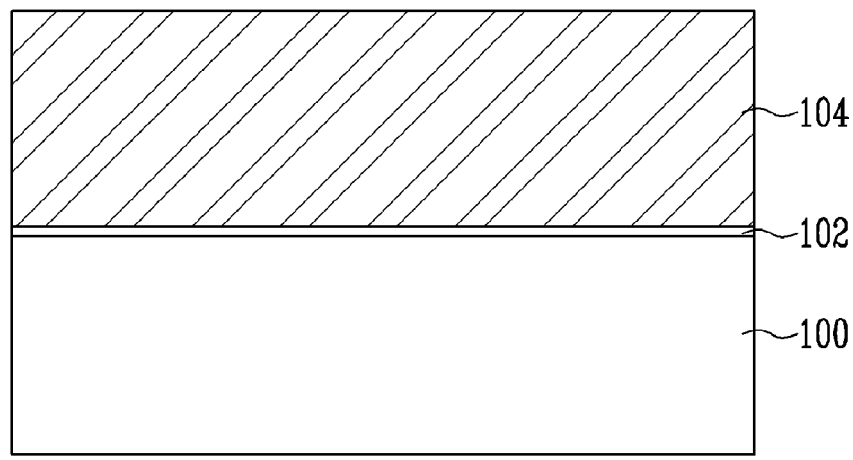
FIGS. 1A to 1I are sectional views showing a method of forming a flash memory device according to the present invention.

Hereinafter, the present invention will be described in detail in connection with a specific embodiment with reference to the accompanying drawings. The present embodiment is provided to complete the disclosure of the present invention and to allow those having ordinary skill in the art to understand the scope of the present invention. When it is said that any part, such as a layer, film, area, or plate, is positioned on another part, it means the part is directly on the other part or above the other part with at least one intermediate part. To clarify multiple layers and regions, the thickness of the layers is enlarged in the drawings.

FIGS. 1A to 1I are sectional views showing a method of forming a flash memory device according to the present invention.

Referring to FIG. 1A, a screen insulating layer 102 for protecting a surface of a semiconductor substrate 100 is formed on the semiconductor substrate 100. Wells are formed in the semiconductor substrate 100, and an ion implantation process is performed on the semiconductor substrate 100 in order to control the threshold voltage (Vt). The screen insulating layer 102 may be formed from an oxide layer and may be formed to a thickness of 10 Å to 50 Å. Next, an isolation mask layer 104 is formed on the screen insulating layer 102. The isolation mask layer 104 may be preferably formed from a nitride layer.

Figure 1B:
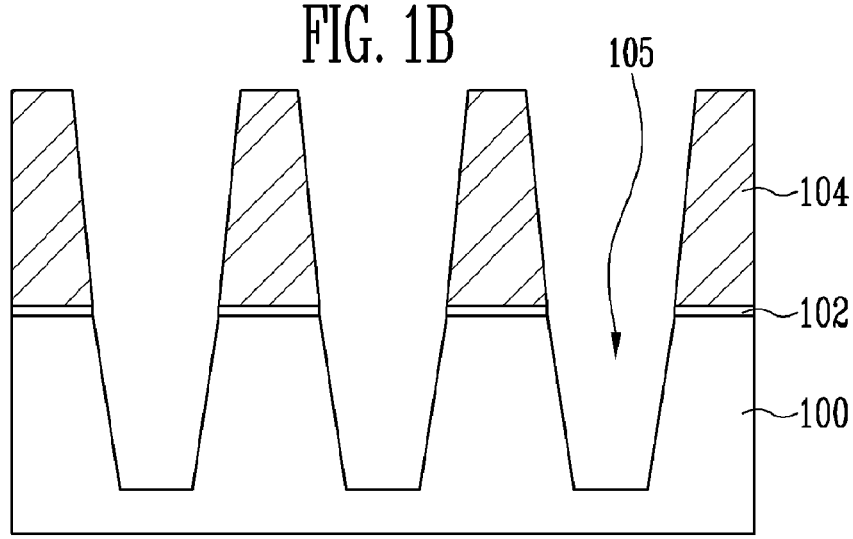

Referring to FIG. 1B, a photoresist pattern (not shown) in which isolation areas are opened is formed on the isolation mask layer 104. The isolation mask layer 104 is patterned by performing an etching process using the photoresist pattern (not shown). An exposed semiconductor substrate 100 is etched in order to form trenches 105 therein. The etching process may be preferably performed using a dry etching process. In view of the etching process, a width at the top of a profile of each of the patterned isolation mask layers 104 is narrower than that at the bottom thereof.

Figure 1C:
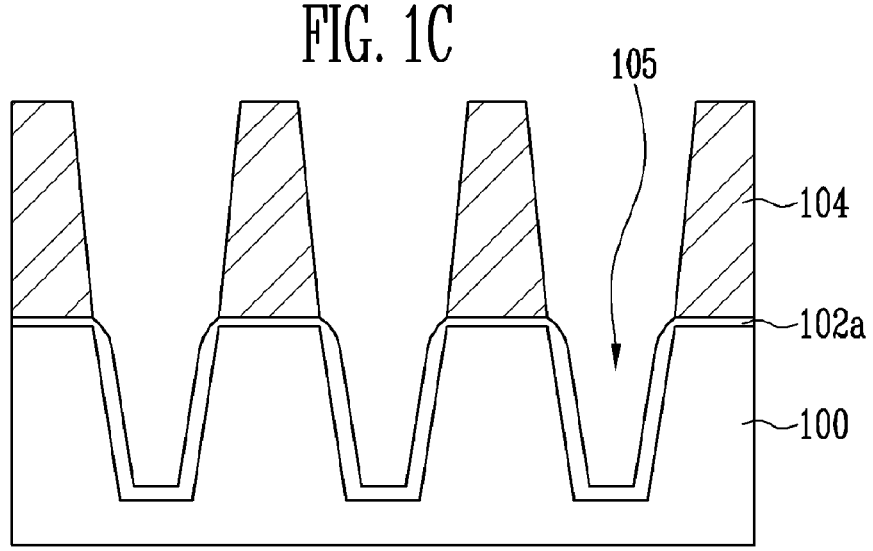

Referring to FIG. 1C, an oxidization process is performed in order to compensate for damage on the semiconductor substrate 100 exposed through the trenches 105. The oxidization process enables a surface of the semiconductor substrate 100 within the trenches 105 to be oxidized, thus forming a wall insulating layer. Further, the semiconductor substrate 100 and the isolation mask layer 104, which are brought in contact with the screen insulating layer 102a, are partially oxidized, so the screen insulating layer 102a may be partially thickened. For example, the oxidization process may be performed sufficiently in order to increase the thickness of the screen insulating layer 102a to 100 Å to 150 Å. If the oxidization process is sufficiently performed as described above, weak oxidation at the top corners of the semiconductor substrate 100 exposed through the trenches 105 can be compensated for.

Figure 1D:
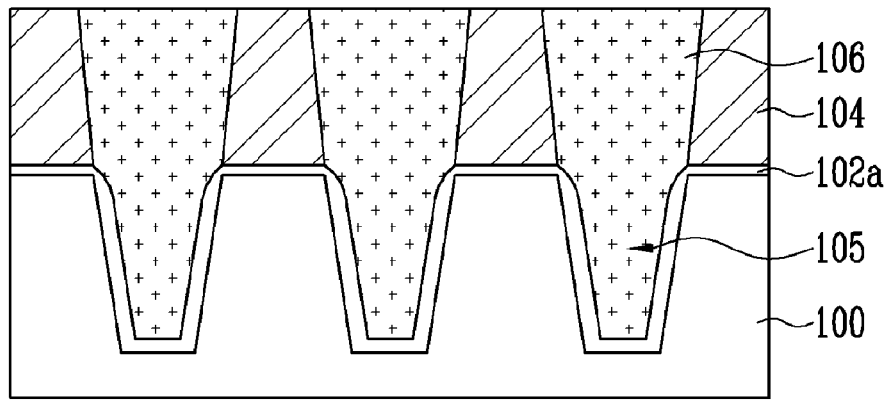

Referring to FIG. 1D, isolation layers 106 are formed within the respective trenches 105 by gap-filling the trenches 105 with an insulating layer. More specifically, the insulating layer is gap-filled within the trenches 105 to a sufficient thickness so that a top surface of the isolation mask layer 104 is fully covered. Next, a polishing process (for example, a Chemical Mechanical Polishing (CMP) process) is performed so that a top surface of each of the isolation layers is exposed, so that the isolation layers 106 remain only within the trenches 105. Through the polishing process, the isolation mask layer 104 may be reduced ½ to ⅓ in thickness.

The insulating layer for the isolation layers 106 may include a High Density Plasma (HDP) layer, a Spin On Dielectric (SOD) layer, or a stack layer of a HDP layer and a SOD layer.

Figure 1E:
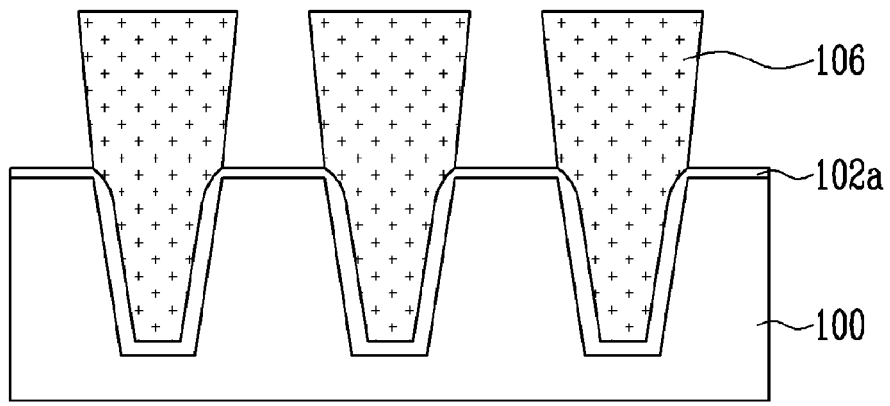

Referring to FIG. 1E, an etching process is performed in order to remove the isolation mask layer 104. For example, in the case in which the isolation mask layer 104 is formed from a nitride layer, the etching process may be preferably performed using a wet etching process. At this time, an etchant may include phosphoric acid ($H_3PO_4$).

If the isolation mask layer 104 is removed, part of each of the isolation layers 106 protrudes upwardly from the semiconductor substrate 100. Further, since a width at the top of each of the protruded isolation layers 106 is wider than that at the bottom thereof, a gap between the protruded isolation layers 106 at the top thereof is narrower than that between the protruded isolation layers 106 at the bottom thereof.

Figure 1F:
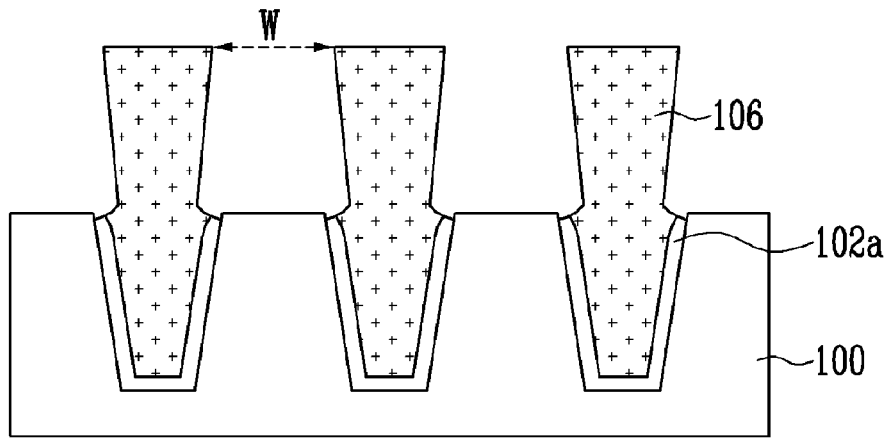

Referring to FIG. 1F, a cleaning process is performed in order to lower the thickness of each of the protruded isolation layers 106 while removing the screen insulating layer 102a formed on the active areas of the semiconductor substrate 100. The cleaning process may be performed using diluted HF or a Buffered Oxide Etchant (BOE). In particular, it is preferred that cleaning time is controlled by taking the increased thickness of the screen insulating layer 102an into consideration. For example, if the cleaning process is performed for a too long time, a top surface of the semiconductor substrate 100 may be damaged because the screen insulating layer 102an is all removed. Accordingly, it is preferred that the screen insulating layer 102a partially remain. Further, a gap W between the protruded isolation layers 106 can be widened because, at the time of the cleaning process, the thickness of each of the protruded isolation layers 106 is decreased and, therefore, a thickness at the sidewall of each of the protruded isolation layers 106 is also reduced. Accordingly, space in which a conductive layer for floating gates, which will be formed later, can be formed easily can be secured.

Figure 1G:
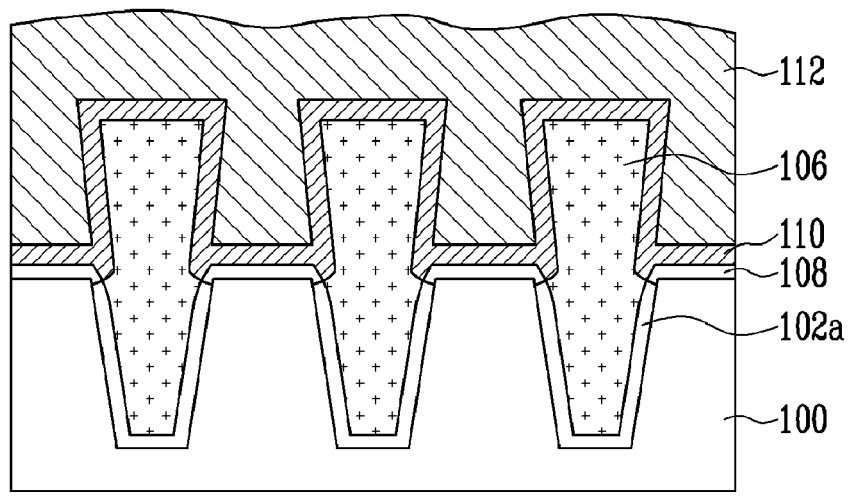

Referring to FIG. 1G, a tunnel dielectric layer 108 for Fowler-Nordheim (FN) tunneling is formed on the exposed semiconductor substrate 100. More specifically, the tunnel dielectric layer 108 may be formed using an oxidization process. In this case, the tunnel dielectric layer 108 may also be thinly formed on a surface of each of the exposed isolation layers 106. However, since an oxide layer is formed more rapidly on the surface of the semiconductor substrate 100 than on the surface of each of the isolation layers 106, the gap between the protruded isolation layers 106 can be maintained without being narrowed.

Next, floating gates 110 and 112 are formed between the protruded isolation layers 106.

More specifically, the floating gates 110 and 112 may be formed by sequentially stacking a first conductive layer 110 and a second conductive layer 112. The first conductive layer 110 may be formed from an undoped polysilicon layer in order to prevent $PH_3$ from being excessively concentrated on the tunnel dielectric layer 108, and the second conductive layer 112 may be formed from a doped polysilicon layer.

In particular, it is preferred that the first conductive layer 110 and the second conductive layer 112 be formed from a crystallized polysilicon layer simultaneously with the formation. That is, crystallized polysilicon has a gradually decreasing grain size (for example, a nano-grain) characteristic.

More specifically, each of grains has a columnar form and can have a uniform width of 15 nm to 30 nm. To this end, the first conductive layer 110 and the second conductive layer 112 may be formed using a mixed gas of a $SiH_4$ gas, that is, a silicon source gas, and an $N_2$ gas, that is, a reaction gas. The first conductive layer 110 and the second conductive layer 112 may be formed using a Chemical Vapor Deposition (CVD) method, and more particularly, formed in a temperature range of 650° C. to 750° C. at a pressure of 10 Torr to 300 Torr.

Further, the second conductive layer 112, that is, the doped polysilicon layer may be formed by injecting an impurity (for example, $PH_3$) in-situ or ex-situ after the first conductive layer 110 is formed. More particularly, the second conductive layer 112 may be formed by injecting an impurity (for example, Phosphorus (P)) at a concentration of $5.0 \times 10^{19}$ atoms/cm$^3$ to $7.0 \times 10^{20}$ atoms/cm$^3$. Further, the second conductive layer 112 may be preferably formed to a thickness sufficiently enough to cover the top surface of each of the protruded isolation layers 106. The second conductive layer 112 may be formed, for example, to a thickness of 200 Å to 1000 Å.

In particular, as described above, in the case in which the crystallized first conductive layer 110 having a nano-grain size and the second conductive layer 112 are gap-filled between the protruded isolation layers 106, when polysilicon layers are brought in contact with each other at the corner portions of the protruded isolation layers 106, the growth speed of each of the polysilicon layer is faster at the corner portions than at other flat portions of the protruded isolation layers 106. Accordingly, the occurrence of void or seam within the floating gates can be prohibited.

Figure 1H:
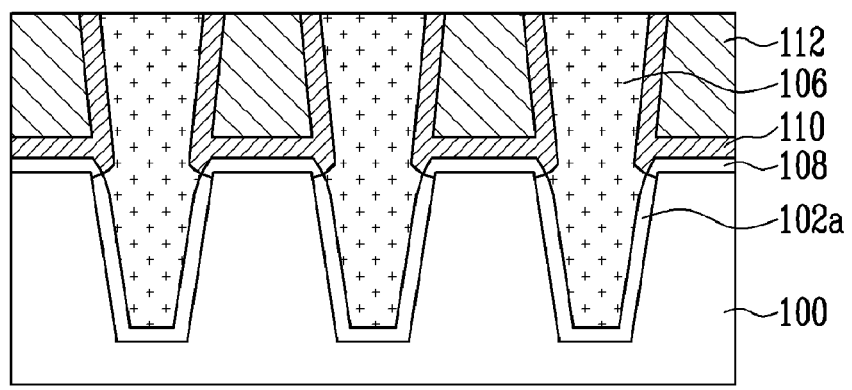

Referring to FIG. 1H, a polishing process is performed on the second and first conductive layers 112 and 110 so that a top surface of each of the protruded isolation layers 106 is exposed. For example, the polishing process may be performed using a CMP process.

Figure 1I:
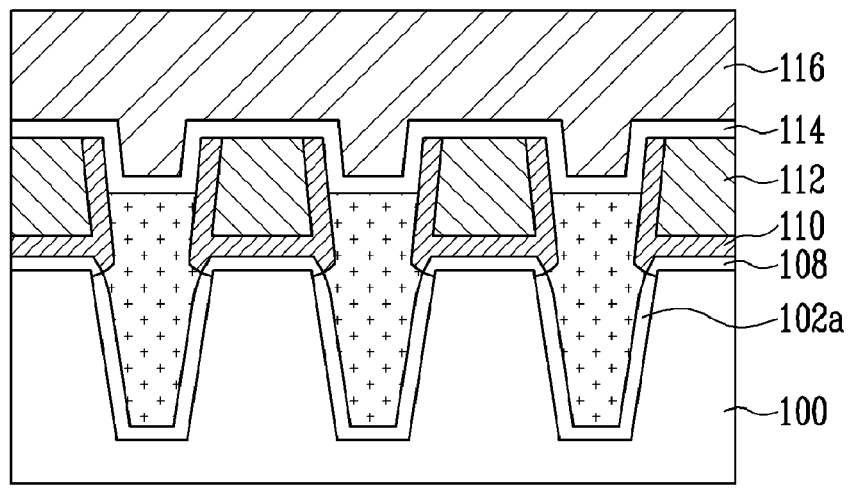

Referring to FIG. 1I, an Effective Field oxide Height (EFH) is controlled by lowering the height of each of the isolation layers 106. Next, a dielectric layer 114 is formed on the entire surfaces of the isolation layers 106, and the first and second conductive layers 110 and 112. A third conductive layer 116 for control gates is formed on the dielectric layer 114.

As described above, since the first and second conductive layers 110 and 112 for floating gates can be formed while prohibiting the occurrence of void or seam, the deterioration of electrical characteristics of a flash memory device can be prevented. Further, since each of the floating gates can be formed to have a uniform grain size, a shift in a subsequent threshold voltage can be decreased.

According to the present invention, after isolation layers protruding upwardly from a semiconductor substrate are formed in a semiconductor substrate in which trenches are formed, the thickness of each of the protruded isolation layers is lowered in order to widen a gap between the protruded isolation layers. Next, a tunnel dielectric layer and a conductive layer for floating gates are formed between the protruded isolation layers, each having a widened gap, so that the occurrence of void or seam can be prevented.

Furthermore, when a process of forming a conductive layer for floating gates is performed, the conductive layer is formed while being crystallized, so the grain size of each of the floating gates can be reduced. Accordingly, a shift in the threshold voltage can be reduced, and the electrical characteristics of a flash device can be improved.

The embodiment disclosed herein has been proposed to allow a person skilled in the art to easily implement the present invention, and the person skilled in the part may implement the present invention in various ways. Therefore, the scope of the present invention is not limited by or to the embodiment as described above, and should be construed to be defined only by the appended claims and their equivalents.

What is claimed is:

1. A method of forming a flash memory device, the method comprising:
    forming a screen insulating layer on a semiconductor substrate;
    forming isolation mask patterns over the screen insulating layer;
    forming trenches by performing an etching process using the isolation mask patterns;
    forming isolation layers by filling the trenches with an insulating layer;
    removing the isolation mask patterns to expose the screen insulating layer, thereby protruding a portion of the isolation layers upwardly from the semiconductor substrate;
    cleaning the protruded isolation layers and the screen insulating layer so that a portion of the protruded isolation layers is etched and the screen insulating layer partially remains;
    forming a tunnel dielectric layer along surface of the resultant structure including the protruded isolation layers;
    forming a first crystallized floating gate along a surface of the tunnel dielectric layer and the protruded isolation layers, wherein the first crystallized floating gate is an undoped polysilicon layer;
    forming a second crystallized floating gate over the first crystallized floating gate to fill a gap between the protruded isolation layers, wherein the second crystallized floating gate is a doped polysilicon layer;
    performing a polishing process to expose the protruded isolation layers; and
    sequentially forming a dielectric layer and a control gate over a resulting structure after performing the polishing process.

2. The method of claim 1, wherein the first and second crystallized floating gates are formed using a mixed gas of a $SiH_4$ gas, that is, a silicon source gas, and an $N_2$ gas, that is, a reaction gas.

3. The method of claim 1, wherein the first and second crystallized floating gates are formed in a temperature range of 650° C. to 750° C. at a pressure of 10 Torr to 300 Torr.

4. The method of claim 1, wherein each of the first and second crystallized floating gates has a grain size of 15 nm to 30 nm.

5. The method of claim 1, wherein the second crystallized floating gate is formed in-situ or ex-situ by injecting $PH_3$ after the first crystallized floating gate is formed.

6. The method of claim 1, wherein the doped polysilicon layer is formed by injecting Phosphorus (P) at a concentration of $5.0 \times 10^{19}$ atoms/cm$^3$ to $7.0 \times 10^{20}$ atoms/cm$^3$.

7. The method of claim 1, wherein the screen insulating layer is formed to a thickness of 10 Å to 50 Å.

8. The method of claim 1, further comprising:
forming a wall insulating layer on the entire surface of the semiconductor substrate exposed through the trenches before the isolation layer is formed.

9. A method of forming a flash memory device, comprising:
sequentially forming a screen insulating layer and an isolation mask pattern over a semiconductor substrate;
forming trenches in the semiconductor substrate by etching the screen insulating layer and the semiconductor substrate using the isolation mask pattern;
forming a wall insulating layer on the entire surface of the semiconductor substrate, including top corners of the semiconductor substrate exposed through the trenches;
forming isolation layers by filling the respective trenches with an insulating layer, wherein each isolation layer partly protrudes upwardly from the semiconductor substrate;
cleaning the protruded isolation layers and the screen insulating layer so that a portion of the protruded isolation layers is etched and the screen insulating layer partially remains, thereby widening a gap between the protruded isolation layers;
forming a tunnel dielectric layer along surface of the resultant structure including the protruded isolation layers;
forming a first crystallized floating gate over the tunnel dielectric layer, wherein the first crystallized floating gate is an undoped polysilicon layer;
forming a second crystallized floating gate over the first crystallized floating gate to fill a gap between the protruded isolation layers, wherein the second crystallized floating gate is a doped polysilicon layer;
removing a portion of the second and first crystallized floating gates to expose the protruded isolation layers; and
sequentially forming a dielectric layer and a control gate along a surface of a resulting structure after removing the portion of the second and first crystallized floating gates.

* * * * *